(12) United States Patent
Jang et al.

(10) Patent No.: US 11,760,907 B2
(45) Date of Patent: Sep. 19, 2023

(54) ADHESIVE RESIN COMPOSITION FOR SEMICONDUCTOR, ADHESIVE FILM FOR SEMICONDUCTOR DEVICE USING THE SAME AND DICING DIE BONDING FILM USING THE SAME

(71) Applicant: LG CHEM, LTD., Seoul (KR)

(72) Inventors: Jong Min Jang, Daejeon (KR); Kwang Joo Lee, Daejeon (KR); Yu Lin Sun, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 17/404,062

(22) Filed: Aug. 17, 2021

(65) Prior Publication Data

US 2022/0089916 A1    Mar. 24, 2022

(30) Foreign Application Priority Data

Aug. 19, 2020 (KR) .................. 10-2020-0104212

(51) Int. Cl.
 *C09J 133/04* (2006.01)
 *C09J 11/04* (2006.01)
 (Continued)

(52) U.S. Cl.
 CPC .......... *C09J 133/068* (2013.01); *C08K 3/042* (2017.05); *C08K 5/0025* (2013.01); *C08K 5/13* (2013.01); *C09J 7/20* (2018.01); *C09J 11/04* (2013.01); *C09J 163/00* (2013.01); *H01L 21/6836* (2013.01); *C08K 2003/222* (2013.01); *C08K 2003/2227* (2013.01); *C08K 2003/2231* (2013.01); *C08K 2003/2262* (2013.01); *C08K 2003/2265* (2013.01); *C08K 2201/01* (2013.01); *C09J 2203/326* (2013.01); *C09J 2301/122* (2020.08); *C09J 2301/208* (2020.08); *C09J 2301/408* (2020.08); *C09J 2400/10* (2013.01); *C09J 2433/00* (2013.01); *C09J 2463/00* (2013.01); *H01L 2221/68327* (2013.01)

(58) Field of Classification Search
 None
 See application file for complete search history.

(56) References Cited

U.S. PATENT DOCUMENTS

2014/0346389 A1* 11/2014 Rowe .................. H01F 3/08
                                                           427/127
2020/0362209 A1* 11/2020 Jang .................. C09J 9/00

FOREIGN PATENT DOCUMENTS

CN    108010649 A    5/2018
EP    2470613 A1    7/2012
(Continued)

OTHER PUBLICATIONS

Machine translation of JP-2006269892-A (Year: 2006).*

*Primary Examiner* — Frank D Ducheneaux
(74) *Attorney, Agent, or Firm* — ROTHWELL, FIGG, ERNST & MANBECK, P.C.

(57) ABSTRACT

The present disclosure relates to an adhesive film for a semiconductor and a dicing die-bonding film the same, and particularly, to an adhesive film for a semiconductor, which may reduce electromagnetic interference generated in a semiconductor package by including a polymer matrix in which a magnetic filler including a core and a coating layer formed on the surface of the core is dispersed, and a dicing die-bonding film including the same.

9 Claims, 7 Drawing Sheets

(51) Int. Cl.
  *C09J 7/20* (2018.01)
  *C08K 5/13* (2006.01)
  *C09J 163/00* (2006.01)
  *C09J 133/06* (2006.01)
  *H01L 21/683* (2006.01)
  *C08K 5/00* (2006.01)
  *C08K 3/04* (2006.01)
  *C08K 3/22* (2006.01)

(56) References Cited

FOREIGN PATENT DOCUMENTS

| | | | | |
|---|---|---|---|---|
| JP | 2006269892 A | * | 10/2006 | |
| JP | 2006269892 A | | 10/2006 | |
| JP | 2019-210447 A | | 12/2019 | |
| KR | 10-2005-0044409 A | | 5/2005 | |
| KR | 10-2012-0122389 A | | 11/2012 | |
| KR | 10-2019-0094090 A | | 8/2019 | |
| KR | 10-2020-0058704 A | | 5/2020 | |
| TW | 2019-34693 A | | 9/2019 | |
| WO | WO-2011023430 A1 | * | 3/2011 | ............... C09J 11/04 |
| WO | WO-2019151645 A1 | * | 8/2019 | ........ C08F 220/1804 |

* cited by examiner

[Fig. 1]
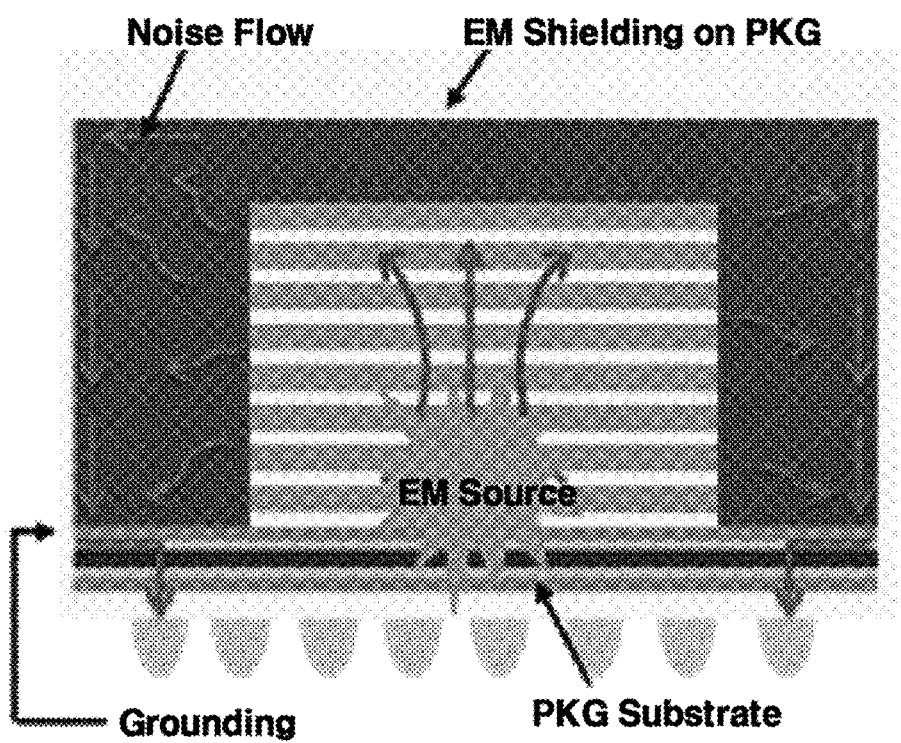

[Fig. 2]
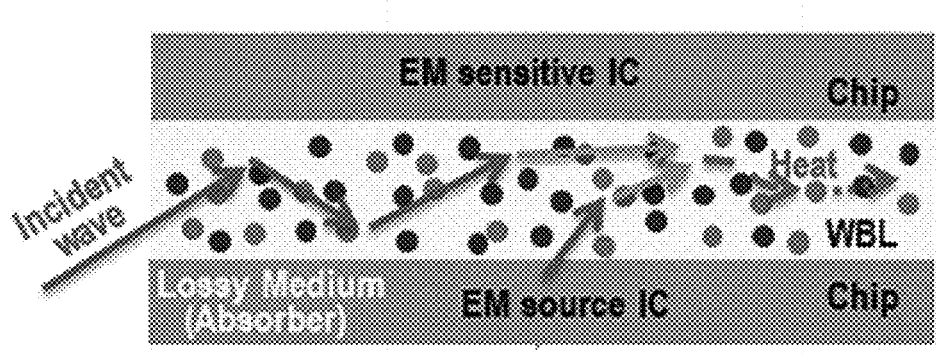

[Fig. 3]
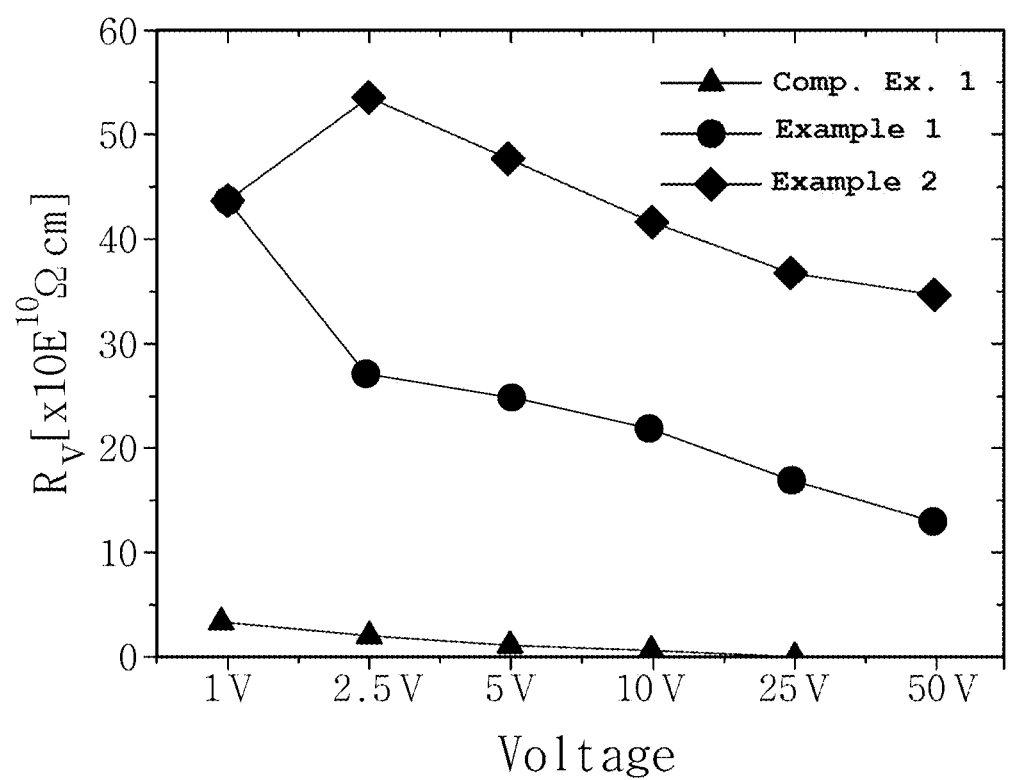

[Fig. 4]
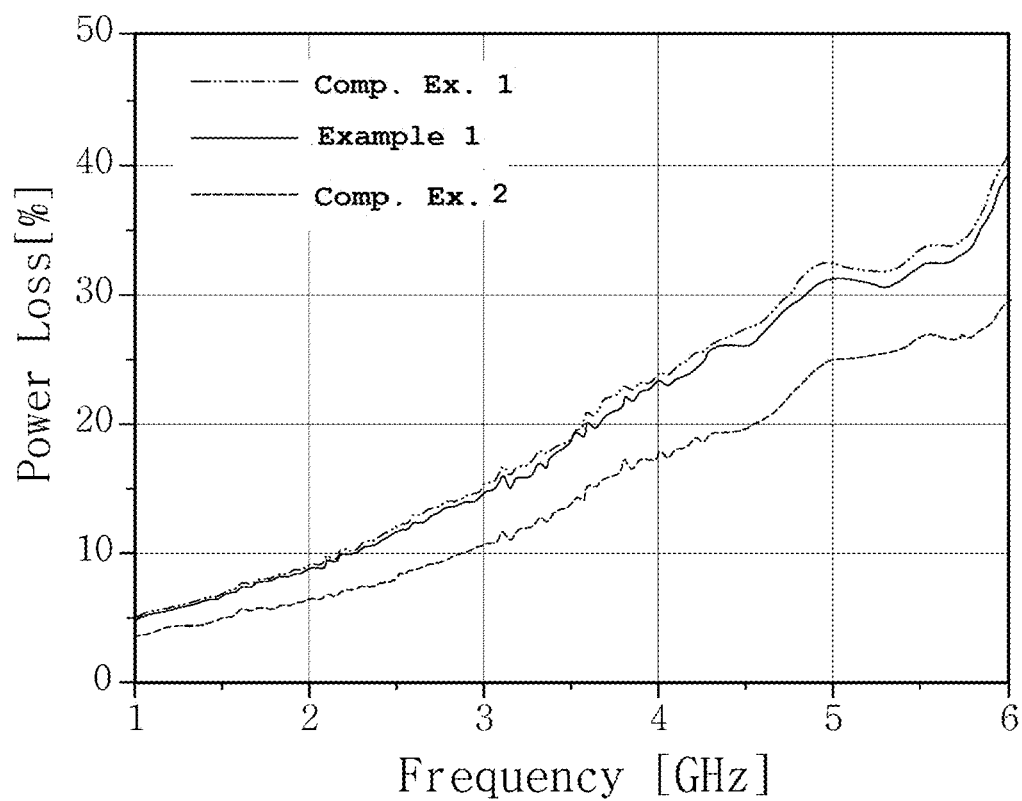

[Fig. 5]
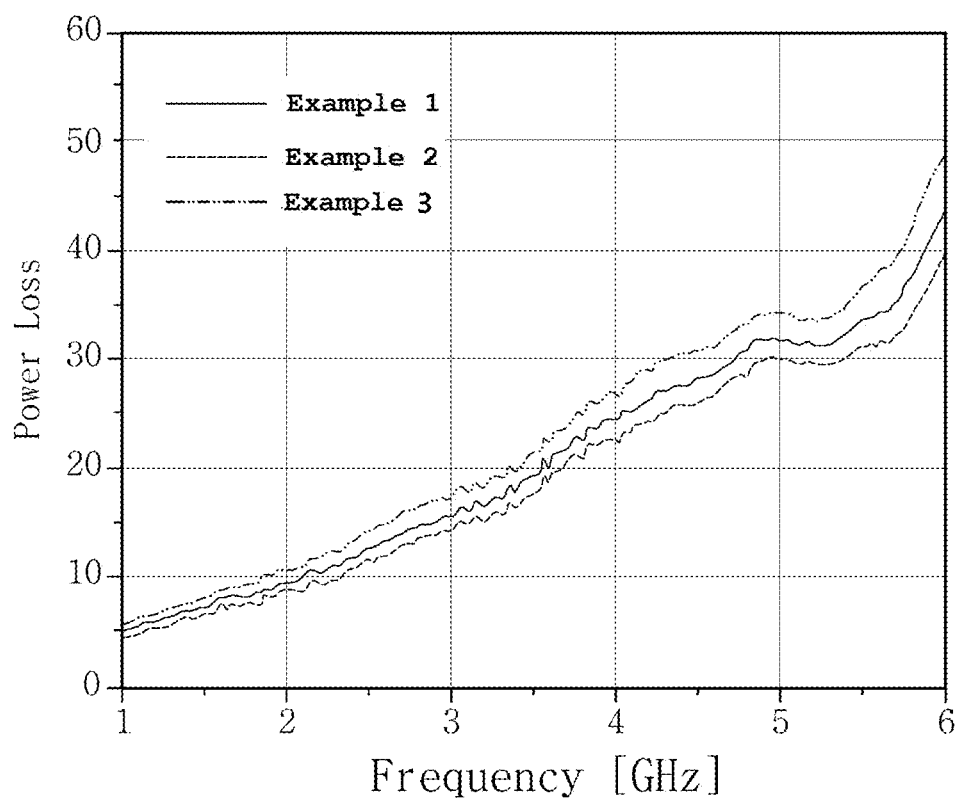

[Fig. 6]
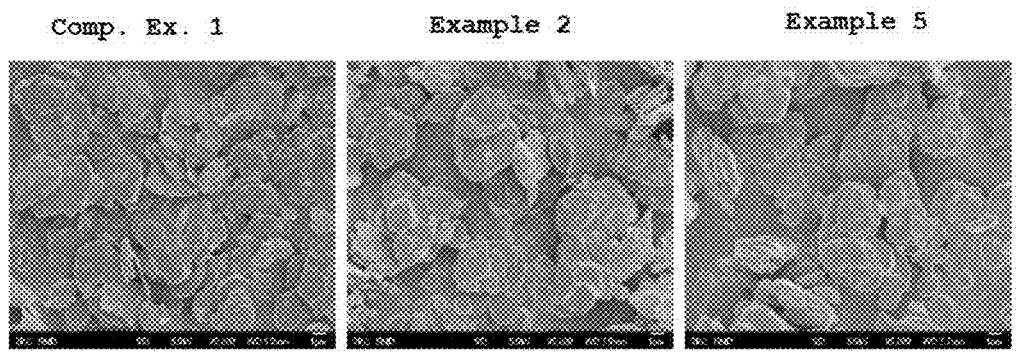

[Fig. 7]
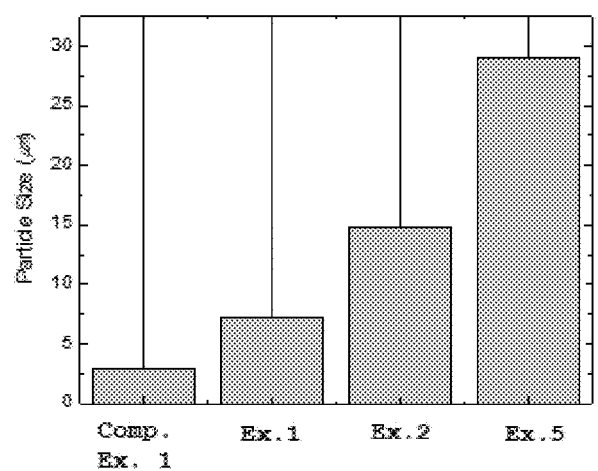

ADHESIVE RESIN COMPOSITION FOR SEMICONDUCTOR, ADHESIVE FILM FOR SEMICONDUCTOR DEVICE USING THE SAME AND DICING DIE BONDING FILM USING THE SAME

TECHNICAL FIELD

This application claims the benefit of the filing date of Korean Patent Application No. 10-2020-0104212 filed with the Korean Intellectual Property Office on Aug. 19, 2020, the entire content of which is incorporated herein by reference.

The present disclosure relates to an adhesive resin composition for a semiconductor, an adhesive film for a semiconductor including the same, and a dicing die-bonding film including the same, and particularly, to an adhesive resin composition for a semiconductor, which may reduce electromagnetic interference generated in a semiconductor package by including a polymer matrix in which a magnetic filler including a core and a coating layer formed on the surface of the core is dispersed, an adhesive film for a semiconductor including the same, and a dicing die-bonding film including the same.

BACKGROUND OF THE INVENTION

In recent years, as the tendency toward miniaturization, high functionalization, and capacity enlargement of electronic devices has been expanding and thus a demand for densification and high integration of semiconductor packages has rapidly increased, the sizes of semiconductor chips have become larger and larger. For improvement in terms of the integration density of semiconductor devices, the use of a stack packaging method for stacking chips in multiple layers has gradually increased.

Depending on the use of the multilayered semiconductor stack package as described above, the thickness of a chip becomes thinner and the degree of integration of circuits becomes higher. However, the modulus of the chip itself is lowered, causing problems in terms of the fabrication process and the reliability of the final product. In order to overcome these problems, attempts have been made to enhance the physical properties of an adhesive for use in the semiconductor packaging process.

In addition, as a semiconductor chip has recently become thinner, a problem arises in that the chip is damaged in an existing blade cutting process, resulting in a decrease in yield. In order to overcome this problem, a fabrication process of cutting a semiconductor chip with a blade and then polishing the chip has been proposed. Since an adhesive is not divided into parts in this fabrication process, the adhesive is cut using a laser, and then divided into parts through a process of expanding a substrate film at low temperature. In addition, in recent years, in order to protect the circuit on a chip, a process of dividing an adhesive into parts only through a low-temperature expanding process and a heat shrinking process without using a laser has been applied.

Meanwhile, in recent years, as electronic devices and electronic components become lighter in weight and smaller in size, the integration density of electrical devices has increased, and the generation of electromagnetic waves in electrical devices operating with electric energy has also greatly increased. Accordingly, there is a growing demand for improvement in the property of effectively absorbing or dissipating electromagnetic waves generated from electronic devices.

Specifically, FIG. 1 is a schematic diagram showing a process of shielding electromagnetic interference (EMI) in a conventional art. To solve the problem associated with noise caused by electromagnetic interference (EMI) in a semiconductor package, noise caused by electromagnetic interference (EMI) is generally blocked at the package level. To this end, noise caused by electromagnetic interference (EMI) generated in an external package or external component is blocked through a ground connection formed outside the package by a spray or sputtering method.

However, with the advent of the high-frequency era, especially the 5G era, noise occurs due to near-field electromagnetic interference (EMI) generated at the chip level, and electromagnetic interference (EMI) between chips needs to be blocked. Thus, there is an urgent need to develop a technology for blocking such noise and electromagnetic interference (EMI).

BRIEF SUMMARY OF THE INVENTION

A technical problem to be achieved by the present disclosure is to provide an adhesive resin composition for a semiconductor, which is capable of minimizing noise caused by electromagnetic interference and capable of reducing the interference between chips caused by an increased integration density of semiconductor packages as a result of including a polymer matrix in which a magnetic filler including a core and a coating layer formed on the surface of the core is effectively dispersed, and controlling the components of the core and the coating layer and the contents of the components, and an adhesive film for a semiconductor and a dicing die-bonding film, which include the adhesive resin composition.

However, the technical problem to be achieved by the present disclosure is not limited to the above-mentioned problem, and other problems not mentioned herein will be clearly understood by those skilled in the art from the following description.

One embodiment of the present disclosure provides an adhesive resin composition for a semiconductor containing: a polymer matrix including a (meth)acrylate-based resin including a (meth)acrylate-based repeating unit containing an epoxy-based functional group and a (meth)acrylate-based repeating unit (BzMA) containing an aromatic functional group, a curing agent including a phenolic resin, and an epoxy resin; and a magnetic filler dispersed in the polymer matrix and including a core and a coating layer formed on the surface of the core, wherein the coating layer includes one selected from the group consisting of yttrium oxide, magnesium oxide, aluminum oxide, silicon oxide, ferrite, and combinations thereof.

Another embodiment of the present disclosure provides an adhesive film for a semiconductor including the adhesive resin composition for a semiconductor.

Still another embodiment of the present disclosure provides a dicing die-bonding film including: a substrate film; a first adhesive layer formed on the substrate film; and a second adhesive layer formed on the first adhesive layer and including the adhesive film for a semiconductor.

BRIEF DESCRIPTION OF THE DRAWINGS

FIG. 1 is a schematic view showing a process of shielding electromagnetic interference (EMI) according to a conventional art.

FIG. 2 is a schematic view showing a process of reducing electromagnetic interference (EMI) according to one embodiment of the present disclosure.

FIG. 3 is a graph showing the results of measuring the volume resistivity of each of Examples 1 and 2 and Comparative Example 1.

FIG. 4 is a graph showing the power losses of Example 1 and Comparative Examples 1 and 2.

FIG. 5 is a graph showing the power losses of Examples 1 to 3.

FIG. 6 shows photographs taken with a scanning electron microscope (SEM) in order to analyze the particle shapes of the magnetic fillers used in Comparative Example 1 and Examples 2 and 5.

FIG. 7 is a graph showing the average particle size of the magnetic filler used in each of Comparative Example 1 and Examples 1, 2 and 5 depending on the content of yttrium oxide in the magnetic filler.

DETAILED DESCRIPTION OF THE INVENTION

Throughout the present specification, it is to be understood that when any part is referred to as "including" any component, it does not exclude other components, but may further include other components, unless otherwise specified.

Throughout the present specification, when any member is referred to as being "on" another member, it not only refers to a case where any member is in contact with another member, but also a case where a third member exists between the two members.

Throughout the present specification, the unit "parts by weight" may refer to the ratio of weight between components.

Throughout the present specification, the term "(meth) acrylate" is meant to include acrylate and methacrylate.

Throughout the present specification, the term "A and/or B" refers to "A and B, or "A or B".

Throughout the present specification, the term "repeating unit" may refer to a form in which a monomer is repeated in the polymer formed by reaction thereof. Specifically, the term may refer to a form in which the monomer is repeated while forming the backbone (such as main chain or side chain) of the polymer produced by polymerization.

Throughout the present specification, the "weight-average molecular weight" of any compound may be calculated using the molecular weight and molecular weight distribution of the compound. Specifically, the molecular weight and molecular weight distribution of the compound may be obtained by: placing tetrahydrofuran (THF) and the compound in a 1-ml glass vial to prepare a test sample in which the concentration of the compound is 1 wt %; filtering a standard sample (polystyrene) and the test sample through a filter (pore size: 0.45 μm); injecting each of the sample filtrates into a GPC injector; and comparing the elution time of the test sample with a calibration curve of the standard sample. At this time, Infinity II 1260 (Agilent Technologies, Inc.) may be used as a measurement instrument, and the flow rate and the column temperature may be set at 1.00 mL/min and 40.0° C., respectively.

Throughout the present specification, "glass transition temperature (Tg)" may be measured using differential scanning calorimetry (DSC). Specifically, the glass transition temperature may be measured using a differential scanning calorimeter (DSC, DSC-STAR3, METTLER TOLEDO) by performing a two-cycle experiment in a temperature range of −60° C. to 150° C. while heating a sample in the temperature range at a heating rate of 5° C./min, and then measuring the midpoint of the DSC curve plotted from points having thermal changes.

Hereinafter, the present disclosure will be described in more detail.

One embodiment of the present disclosure provides an adhesive resin composition for a semiconductor containing: a polymer matrix including a (meth)acrylate-based resin including a (meth)acrylate-based repeating unit containing an epoxy-based functional group and a (meth)acrylate-based repeating unit (BzMA) containing an aromatic functional group, a curing agent including a phenolic resin, and an epoxy resin; and a magnetic filler dispersed in the polymer matrix and including a core and a coating layer formed on the surface of the core, wherein the coating layer includes one selected from the group consisting of yttrium oxide, magnesium oxide, aluminum oxide, silicon oxide, ferrite, and combinations thereof. Throughout the present disclosure, the expression "the coating layer includes one selected from the group consisting of yttrium oxide, magnesium oxide, aluminum oxide, silicon oxide, ferrite, and combinations thereof" means that the coating layer includes a metal oxide-based compound.

As the adhesive resin composition for a semiconductor according to one embodiment of the present disclosure includes, in the polymer matrix, the magnetic filler including the core and the coating layer formed on the surface of the core, it is possible to ensure the dielectric property of an adhesive film for a semiconductor including the adhesive resin composition by increasing the volume resistivity of the adhesive film. FIG. 2 is a schematic view showing a process of reducing electromagnetic interference (EMI) according to one embodiment of the present disclosure. Referring to FIG. 2, electromagnetic waves from a place where electromagnetic interference occurs are incident onto the adhesive film for a semiconductor, and the electromagnetic waves are converted into heat by the magnetic filler dispersed in the adhesive film for a semiconductor, so that the electromagnetic waves are reduced.

According to one embodiment of the present disclosure, the polymer matrix may include a (meth)acrylate-based resin including a (meth)acrylate-based repeating unit containing an epoxy-based functional group and a (meth)acrylate-based repeating unit (BzMA) containing an aromatic functional group. As the (meth)acrylate-based resin includes the (meth)acrylate-based repeating unit (BzMA) containing an aromatic functional group, the adhesive film for a semiconductor may ensure higher compatibility and bonding force between the components included therein, may have high elasticity, and may have a relatively enhanced initial tensile modulus. In addition, as the (meth)acrylate-based resin includes the (meth)acrylate-based repeating unit (BzMA) containing an aromatic functional group, it may advantageously act on the dispersibility of the magnetic filler, thereby ensuring a uniform distribution of the filler and increasing the filling rate of the filler.

According to one embodiment of the present disclosure, as the (meth)acrylate-based resin includes the (meth)acrylate-based repeating unit containing an epoxy-based functional group, the adhesive film for a semiconductor may have a more uniform and solid internal structure, and thus may ensure high impact resistance during multilayer stacking of ultra-thin wafers, and it may also enhance electrical properties after semiconductor fabrication.

According to one embodiment of the present disclosure, the content of the (meth)acrylate-based repeating unit containing an aromatic functional group in the (meth)acrylate-based resin may be 2 wt % to 40 wt %, 3 wt % to 30 wt %, or 5 wt % to 25 wt %. If the content of the (meth)acrylate-based repeating unit including an aromatic functional group in the (meth)acrylate-based resin is excessively low, the effect of increasing the compatibility of the (meth)acrylate-based resin with the epoxy resin or phenolic resin and the dispersibility of the filler may be insignificant, and the effect of lowering the hygroscopicity of the finally produced adhesive film may also be insignificant. If the content of the (meth)acrylate-based repeating unit including an aromatic functional group in the (meth)acrylate-based resin is excessively high, the adhesiveness of the adhesive film for a semiconductor may be reduced.

According to one embodiment of the present disclosure, the aromatic functional group may be an aryl group having 6 to 20 carbon atoms, or an arylalkylene group including an aryl group having 6 to 20 carbon atoms and an alkylene group having 1 to 10 carbon atoms.

According to one embodiment of the present disclosure, the (meth)acrylate-based resin may include 3 wt % to 30 wt % of the (meth)acrylate-based repeating unit containing an epoxy-based functional group. Where the content of the (meth)acrylate-based repeating unit containing an epoxy-based functional group is controlled within the above range, it is possible to enhance the curing density and curing rate of the adhesive film for a semiconductor.

According to one embodiment of the present disclosure, the (meth)acrylate-based repeating unit containing an epoxy-based functional group may include an epoxy cycloalkylmethyl (meth)acrylate repeating unit having 3 to 20 carbon atoms. The "epoxy cycloalkylmethyl having 3 to 20 carbon atoms" refers to a structure in which a cycloalkyl having 3 to 30 carbon atoms to which an epoxy group is attached is substituted with a methyl group. An example of the epoxy cycloalkylmethyl (meth)acrylate having 3 to 20 carbon atoms is preferably glycidyl (meth)acrylate or 3,4-epoxycyclohexylmethyl (meth)acrylate.

According to one embodiment of the present disclosure, the (meth)acrylate-based resin may further include at least one repeating unit selected from the group consisting of a vinyl-based repeating unit containing a reactive functional group and a (meth)acrylate-based functional group containing an alkyl group having 1 to 10 carbon atoms.

According to one embodiment of the present disclosure, the reactive functional group may include at least one functional group selected from the group consisting of alcohol, amine, carboxylic acid, epoxide, imide, (meth) acrylate, nitrile, norbornene, olefin, polyethylene glycol, thiol and vinyl groups.

According to one embodiment of the present disclosure, when the (meth)acrylate-based resin further includes at least one repeating unit selected from the group consisting of a vinyl-based repeating unit containing a reactive functional group and a (meth)acrylate-based functional group containing an alkyl group having 1 to 10 carbon atoms, the (meth)acrylate-based resin may contain 0.1 wt % to 20 wt %, or 0.5 wt % to 10 wt % of the (meth)acrylate-based repeating unit containing an epoxy-based functional group.

According to one embodiment of the present disclosure, the (meth)acrylate-based resin may have a glass transition temperature of 0° C. to 20° C. Specifically, the glass transition temperature of the (meth)acrylate-based resin may be 1° C. to 19° C., 2° C. to 18° C., 3° C. to 18° C., 4° C. to 17° C., 5° C. to 16° C., or 6° C. to 15° C. Where the glass transition temperature of the (meth)acrylate-based resin is controlled within the above range, the adhesive film for a semiconductor may ensure high adhesiveness and may be easily produced in the form of a thin film or the like.

According to one embodiment of the present disclosure, the (meth)acrylate-based resin may have a weight-average molecular weight of 50,000 to 1,000,000. Specifically, the weight-average molecular weight of the (meth)acrylate-based resin may be 60,000 to 900,000, 70,000 to 800,000, 100,000 to 700,000, or 200,000 to 600,000. Where the weight-average molecular weight of the (meth)acrylate-based resin is controlled within the above range, the adhesive film for a semiconductor may ensure high adhesiveness and may be easily produced in the form of a thin film or the like. Specifically, if the weight-average molecular weight of the (meth)acrylate-based resin is excessively low, it may not be easy to form the adhesive film for a semiconductor, and thus the cutability of the adhesive film may deteriorate, and accordingly, chip pick-up performance in a package fabrication process may deteriorate. In addition, if the weight-average molecular weight of the (meth)acrylate-based resin is excessively high, the viscosity of the adhesive film for a semiconductor may increase and the high-temperature fluidity of the composition may be lowered. Thus, wafer wettability and embedding properties of the composition may be lowered, and hence voids may remain after package assembly and degrade the reliability of the package.

According to one embodiment of the present disclosure, the ratio of the weight of the (meth)acrylate-based resin to the total weight of the (meth)acrylate-based resin, the epoxy resin and the phenolic resin in the adhesive resin composition for a semiconductor may be 0.55 to 0.95. As the ratio of the weight of the (meth)acrylate-based resin to the total weight of the (meth)acrylate-based resin, the epoxy resin and the phenolic resin in the adhesive resin composition for a semiconductor is controlled within the above-described range, the adhesive film for a semiconductor may have high elasticity, excellent mechanical properties and high adhesiveness while exhibiting a relatively high modulus during initial tension. Specifically, if the ratio of the weight of the (meth)acrylate-based resin to the total weight of the (meth) acrylate-based resin, the epoxy resin and the phenolic resin is lower than the lower limit of the above-described range, the adhesiveness of the adhesive film for a semiconductor may be reduced, and thus the wettability thereof on a wafer may be reduced, making it impossible to ensure a uniform division property of the adhesive film, and the interfacial adhesive force between the wafer and the adhesive film may be reduced due to low adhesion therebetween, resulting in reduced reliability. If the ratio of the weight of the (meth) acrylate-based resin to the total weight of the (meth)acrylate-based resin, the epoxy resin and the phenolic resin is higher than the upper limit of the above-described range, the modulus occurring when the adhesive film for a semiconductor is stretched by 5% to 15% at room temperature may be insufficient, and the tensile strain of the adhesive film at room temperature may be very high.

According to one embodiment of the present disclosure, the weight ratio between the epoxy resin and the phenolic resin in the adhesive resin composition for a semiconductor may be controlled in consideration of the properties of the finally produced product. For example, the weight ratio may be 10:1 to 1:10.

According to one embodiment of the present disclosure, the phenolic resin may have a hydroxyl equivalent weight of 80 g/eq to 400 g/eq. Specifically, the phenolic resin may have a hydroxyl equivalent weight of 90 g/eq to 250 g/eq, 100 g/eq to 178 g/eq, or 210 g/eq to 240 g/eq. Where the phenolic resin has a hydroxyl equivalent weight within the above range, it is possible to impart an excellent adhesive property to the adhesive resin composition by increasing the degree of curing of the composition even when the content of the phenolic resin is low.

The adhesive resin composition for a semiconductor according to the present disclosure contains an epoxy resin. As the epoxy resin is contained as described above, it may serve to control the degree of curing of the adhesive resin composition for a semiconductor or to increase the adhesive performance thereof.

According to one embodiment of the present disclosure, the epoxy resin may be at least one polymer resin selected from the group consisting of biphenyl-based epoxy resin, bisphenol A epoxy resin, bisphenol F epoxy resin, cresol novolac epoxy resin, phenol novolac epoxy resin, tetrafunctional epoxy resin, triphenolmethane-type epoxy resin, alkyl-modified triphenolmethane-type epoxy resin, naphthalene-type epoxy resin, dicyclopentadiene-type epoxy resin, and dicyclopentadiene-modified phenol-type epoxy resin.

According to one embodiment of the present disclosure, the softening point of the epoxy resin may be −50° C. to 100° C. If the softening point of the epoxy resin is excessively low, the adhesiveness of the adhesive resin composition for a semiconductor may increase, and thus chip pick-up performance after dicing may be reduced, and if the softening point of the epoxy resin is excessively high, the high-temperature fluidity of the adhesive resin composition for a semiconductor may be reduced, and the adhesiveness of the adhesive film for a semiconductor may be reduced.

According to one embodiment of the present disclosure, the epoxy resin that is used in the present disclosure may be a combination of two or more epoxy resins having different softening points. Where the epoxy resin used is a combination of two or more epoxy resins having different softening points as described above, it is possible to ensure sufficient fluidity of the adhesive resin composition in a packaging assembly process.

According to one embodiment of the present disclosure, the epoxy equivalent weight of the epoxy resin may be 100 g/eq to 300 g/eq.

According to one embodiment of the present disclosure, the curing agent may further include at least one compound selected from the group consisting of an amine-based curing agent and an acid anhydride-based curing agent. The amount of the curing agent used may be appropriately selected in consideration of the physical properties of the finally produced adhesive film. For example, the curing agent may be used in an amount of 10 parts by weight to 700 parts by weight, or 30 parts by weight to 300 parts by weight, based on 100 parts by weight of the epoxy resin.

According to one embodiment of the present disclosure, the adhesive resin composition for a semiconductor may further contain a curing catalyst. The curing catalyst serves to promote the action of the curing agent or to accelerate curing in a process of producing the adhesive film for a semiconductor, and any curing catalyst known to be used in the production of an adhesive film for a semiconductor, etc. may be used without particular limitation. For example, as the curing catalyst, there may be used at least one selected from the group consisting of a phosphorus-based compound, a boron-based compound, a phosphorus-boron-based compound, and an imidazole-based compound. The amount of the curing catalyst used may be appropriately selected in consideration of the physical properties of the finally produced adhesive film. For example, the curing catalyst may be used in an amount of 0.5 parts by weight to 10 parts by weight based on 100 parts by weight of the total weight of the liquid and solid epoxy resins, the (meth)acrylate-based resin and the phenolic resin.

According to one embodiment of the present disclosure, the adhesive resin composition for a semiconductor may further contain an ion scavenger including: a metal oxide including at least one metal selected from the group consisting of zirconium, antimony, bismuth, magnesium and aluminum; or porous silicate; or porous aluminosilicate; or zeolite.

According to one embodiment of the present disclosure, the metal oxide may be zirconium oxide, antimony oxide, bismuth oxide, magnesium oxide, aluminum oxide, antimony bismuth-based oxide, zirconium bismuth-based oxide, zirconium magnesium-based oxide, magnesium aluminum-based oxide, antimony magnesium-based oxide, antimony aluminum-based oxide, antimony zirconium-based oxide, zirconium aluminum-based oxide, bismuth magnesium-based oxide, bismuth aluminum-based oxide, or a mixture of two or more thereof.

The ion scavenger may serve to adsorb metal ions or halogen ions present in the adhesive film for a semiconductor, thereby enhancing electrical reliability of wirings coming into contact with the adhesive film.

According to one embodiment of the present disclosure, the content of the ion scavenger in the adhesive resin composition for a semiconductor is not particularly limited, but may be 0.01 wt % to 20 wt %, preferably 0.01 wt % to 10 wt %, based on the weight of the adhesive resin composition for a semiconductor, in view of the reactivity of the ion scavenger with transition metal ions and the workability of the composition.

According to one embodiment of the present disclosure, the adhesive resin composition for a semiconductor may further contain one or more additives selected from the group consisting of a coupling agent and an inorganic filler. Specific examples of the coupling agent and the inorganic filler are not limited, and components known to be used in an adhesive for semiconductor packaging may be used without particular limitation.

The adhesive resin composition for a semiconductor according to the present disclosure contains a magnetic filler dispersed in the polymer matrix and including a core and a coating layer formed on the surface of the core. As the adhesive resin composition contains the magnetic filler including the core and the coating layer formed on the surface of the core as described above, it may minimize noise caused by electromagnetic interference generated from a chip, etc.

According to one embodiment of the present disclosure, the content of the magnetic filler may be 30 parts by weight to 70 parts by weight based on 100 parts by weight of the polymer matrix. Specifically, the content of the magnetic filler may be 35 parts by weight to 65 parts by weight, or 40 parts by weight to 60 parts by weight, based on 100 parts by weight of the polymer matrix. Where the content of the magnetic filler is controlled within the above-described range, it is possible to increase the power loss rate.

According to one embodiment of the present disclosure, the core may be made of one selected from the group consisting of iron carbide, ferrite, tin-manganese, iron (III) oxide, sendust, iron nitride, manganese-based ferrite (Mn-ferrite), manganese-magnesium-strontium-based ferrite (Mn—Mg—Sr-ferrite), graphene, and combinations thereof. Where the material of the core is selected from those described above, the magnetic filler may satisfy electrical reliability and maximally absorb electromagnetic waves at a frequency of 1 GHz to 6 GHz.

According to one embodiment of the present disclosure, the thickness of the coating layer may be 10 nm to 500 nm. Specifically, the thickness of the coating layer may be 50 nm to 450 nm, 100 nm to 400 nm, 150 nm to 350 nm, or 200 nm to 300 nm. Where the thickness of the coating layer is controlled within the above range, it is possible to ensure the dielectric properties of the adhesive film for a semiconductor.

According to one embodiment of the present disclosure, the content of the coating layer included in the magnetic filler may be 50 parts by weight to 150 parts by weight based on 100 parts by weight of the core. Specifically, the content of the coating layer included in the magnetic filler is 50 parts by weight to 150 parts by weight, 60 parts by weight to 140 parts by weight, 70 parts by weight to 130 parts by weight, 80 parts by weight to 120 parts by weight, or 90 parts by weight to 110 parts by weight, based on 100 parts by weight of the core. Where the content of the coating layer included in the magnetic filler is controlled within the above-described range, it is possible to minimize noise caused by electromagnetic interference generated from a chip, etc.

According to one embodiment of the present disclosure, the content of one selected from the group consisting of yttrium oxide, magnesium oxide, aluminum oxide, silicon oxide, ferrite, and combinations thereof may be 5 parts by weight to 15 parts by weight based on 100 parts by weight of the coating layer. Specifically, one selected from the group consisting of yttrium oxide, magnesium oxide, aluminum oxide, silicon oxide, ferrite, and combinations thereof may refer to a metal oxide-based compound, and the content of the metal oxide-based compound may be 5 parts by weight to 15 parts by weight based on 100 parts by weight of the coating layer. More specifically, the content of one selected from the group consisting of yttrium oxide, magnesium oxide, aluminum oxide, silicon oxide, ferrite, and a combination thereof may be 6 parts by weight to 14 parts by weight, 4 parts by weight to 16 parts by weight, or 7 parts by weight to 13 parts by weight, based on 100 parts by weight of the coating layer. Where the content of one selected from the group consisting of yttrium oxide, magnesium oxide, aluminum oxide, silicon oxide, ferrite, and combinations thereof is controlled within the above range, the magnetic filler may maximally absorb electromagnetic waves at a frequency of 1 GHz to 6 GHz.

Another embodiment of the present disclosure provides an adhesive film for a semiconductor including the adhesive resin composition for a semiconductor.

As the adhesive film for a semiconductor according to one embodiment of the present disclosure includes, in the polymer matrix, the magnetic filler including the core and the coating layer formed on the surface of the core, it may have an increased volume resistivity, and thus may effectively reduce electromagnetic interference.

According to one embodiment of the present disclosure, the adhesive film for a semiconductor may have a thickness of 1 μm to 300 μm. In addition, the adhesive film for a semiconductor may have a thickness of 1 μm or more, or 3 μm or more, or 5 μm or more, or 10 μm or more. In addition, the adhesive film for a semiconductor may have a thickness of 300 μm or less, or 100 μm or less, or 90 μm or less, or 70 μm or less.

According to one embodiment of the present disclosure, when the adhesive film for a semiconductor is applied to a multilayer package structure of a semiconductor chip, it is possible to realize a more stable structure and excellent mechanical properties such as heat resistance and impact resistance, and prevent the occurrence of reflow cracks or the like. In particular, voids may not substantially occur even when the package structure is exposed for a long time to high temperature conditions that are applied in a semiconductor fabrication process.

According to one embodiment of the present disclosure, the adhesive film for a semiconductor has a high breaking strength and a low elongation at break, and thus is applicable not only to a method of cutting a wafer using a blade, but also to other non-contact adhesive cutting methods, for example, dicing-before-grinding (DBG). In addition, the adhesive film for a semiconductor has an excellent property of being divided into parts even at low temperatures, and thus has a low possibility of re-adhesion even when being left at room temperature after cutting, thereby increasing the reliability and efficiency of a semiconductor fabrication process.

According to one embodiment of the present disclosure, the adhesive film may be used as a die attach film (DAF) for bonding a lead frame or a substrate to a die or bonding between dies. Accordingly, the adhesive film may be processed in the form of a die bonding film or a dicing die-bonding film.

Still another embodiment of the present disclosure provides a dicing die-bonding film including: a substrate film; a first adhesive layer formed on the substrate film; and a second adhesive layer formed on the first adhesive layer and including the adhesive film for a semiconductor.

The dicing die-bonding film according to one embodiment of the present disclosure may minimize noise caused by electromagnetic interference occurring between semiconductor packages, and may solve the problem associated with noise caused by electromagnetic interference between chips.

According to one embodiment of the present disclosure, the type of substrate film included in the dicing die-bonding film is not particularly limited. For example, a plastic film or metal foil known in the art may be used as the substrate film. For example, the substrate film may include low-density polyethylene, linear polyethylene, medium-density polyethylene, high-density polyethylene, ultra-low-density polyethylene, a random copolymer of polypropylene, a block copolymer of polypropylene, homopolypropylene, polymethylpentene, an ethylene-vinyl acetate copolymer, an ethylene-methacrylic acid copolymer, an ethylene-methyl methacrylate copolymer, an ethylene-ionomer copolymer, an ethylene-vinyl alcohol copolymer, polybutene, a styrene copolymer, or a mixture of two or more thereof. Here, the substrate film including the mixture of two or more polymers is meant to include a film having a structure in which two or more films including the above-described polymers, respectively, are laminated to each other, or a monolayered film including two or more of the above-mentioned polymers.

According to one embodiment of the present disclosure, the thickness of the substrate film is not particularly limited, and is generally 10 μm to 200 μm, preferably 50 μm to 180 μm. If the thickness is less than 10 μm, a problem may arise in that the control of the cut depth in the dicing process is unstable, and if the thickness is more than 200 μm, a problem may arise in that a large amount of burrs occur in the dicing process, or the expanding process is not performed accurately due to the reduced elongation of the film.

According to one embodiment of the present disclosure, the substrate film may be subjected to conventional physical or chemical treatment such as matting treatment, corona discharge treatment, primer treatment or crosslinking treatment, if necessary.

According to one embodiment of the present disclosure, the first adhesive layer may include a UV-curable adhesive or a heat-curable adhesive. When the UV-curable adhesive is used, the adhesiveness thereof is reduced by irradiating the substrate film side with UV light to increase the cohesiveness and glass transition temperature of the adhesive. When the heat-curable adhesive is used, the adhesiveness thereof is reduced by applying heat thereto.

According to one embodiment of the present disclosure, the UV-curable adhesive may include a (meth)acrylate-based resin, a UV-curable compound, a photoinitiator, and a crosslinking agent.

According to one embodiment of the present disclosure, the (meth)acrylate-based resin may have a weight-average molecular weight of 100,000 g/mol to 1,500,000 g/mol, preferably 200,000 g/mol to 1,000,000 g/mol. If the weight-average molecular weight is less than 100,000 g/mol, a problem may arise in that the coatability or cohesiveness of the UV-curable adhesive is lowered, and thus a residue remains on the adherend after peeling, or a phenomenon occurs in which the adhesive is broken. Meanwhile, if the weight-average molecular weight is more than 1,500,000 g/mol, a problem may arise in that the (meth)acrylate-based resin interferes with the reaction of the UV-curable compound, and thus the peel force of the adhesive is not effectively reduced.

According to one embodiment of the present disclosure, the (meth)acrylate-based resin may be, for example, a copolymer of a (meth)acrylic acid ester-based monomer and a monomer containing a crosslinkable functional group. In this case, examples of the (meth)acrylic acid ester-based monomer include alkyl (meth)acrylates, and more specifically, include monomers each having an alkyl group having 1 to 12 carbon atoms. More specifically, the (meth)acrylate-based monomer may be one or a mixture of two or more selected from among pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethyl hexyl (meth)acrylate, dodecyl (meth)acrylate, and decyl (meth)acrylate. As a monomer containing an alkyl group having a larger number of carbon atoms is used, the glass transition temperature of the final copolymer becomes lower. Thus, an appropriate monomer may be selected depending on the desired glass transition temperature.

According to one embodiment of the present disclosure, examples of the monomer containing a crosslinkable functional group include one or a mixture of two or more selected from among a monomer containing a hydroxyl group, a monomer containing a carboxyl group, and a nitrogen-containing monomer. Here, examples of the hydroxyl group-containing compound include, but are not limited to, 2-hydroxyethyl (meth)acrylate, and 2-hydroxypropyl (meth)acrylate, and examples of the carboxyl group-containing compound include, but are not limited to, (meth)acrylic acid, and examples of the nitrogen-containing monomer include, but are not limited to, (meth)acrylonitrile, N-vinyl pyrrolidone, and N-vinyl caprolactam.

According to one embodiment of the present disclosure, the (meth)acrylate-based resin may further include a carbon-carbon double bond-containing low-molecular-weight compound, such as vinyl acetate, styrene, or acrylonitrile, from the viewpoint of improving other functionalities such as compatibility.

According to one embodiment of the present disclosure, the type of UV-curable compound is not particularly limited, and for example, a polyfunctional compound (e.g., polyfunctional urethane acrylate, a polyfunctional acrylate monomer or oligomer, etc.) having a weight-average molecular weight of 100 g/mol to 300,000 g/mol, or 500 g/mol to 100,000 g/mol may be used as the UV-curable compound. A person of ordinary skill in the art can readily select an appropriate compound according to the intended use. The weight-average molecular weight is the weight-average molecular weight in terms of polystyrene measured by the GPC method.

According to one embodiment of the present disclosure, the content of the UV-curable compound may be 5 parts by weight to 400 parts by weight, preferably 10 parts by weight to 200 parts by weight, based on 100 parts by weight of the above-described (meth)acrylate-based resin. If the content of the UV-curable compound is less than 5 parts by weight, a problem may arise in that pickup performance may deteriorate due to an insufficient decrease in adhesiveness after curing, and if the content of the UV-curable compound is more than 400 parts by weight, a problem may arise in that the cohesiveness of the adhesive before UV irradiation is insufficient, or peeling from a release film, etc. is not easily achieved.

According to one embodiment of the present disclosure, the type of photoinitiator is also not particularly limited, and a common photoinitiator known in the art may be used. The content of the photoinitiator may be 0.05 parts by weight to 20 parts by weight based on 100 parts by weight of the UV-curable compound. If the content of the photoinitiator is less than 0.05 parts by weight, a problem may arise in that the curing reaction by UV irradiation is insufficient, and thus pick-up performance deteriorates, and if the content of the photoinitiator is more than 20 parts by weight, a problem may arise in that the crosslinking reaction during the curing process occurs in short units, or a unreacted UV-curable compound remains and causes residue on the surface of the adherend, or the peeling force after curing is excessively reduced, resulting in deterioration in pick-up performance.

According to one embodiment of the present disclosure, the type of crosslinking agent included in the first adhesive layer to impart adhesiveness and cohesiveness is also not particularly limited, and a conventional compound such as an isocyanate-based compound, an aziridine-based compound, an epoxy-based compound or a metal chelate-based compound may be used as the crosslinking agent. The crosslinking agent may be contained in an amount of 2 parts by weight to 40 parts by weight, preferably 2 parts by weight to 20 parts by weight, based on 100 parts by weight of the (meth)acrylate-based resin. If the content of the crosslinking agent is less than 2 parts by weight, a problem may arise in that the cohesiveness of the adhesive is insufficient, and if the content is more than 20 parts by weight, a problem may arise in that the adhesiveness of the adhesive before UV irradiation is insufficient, and thus chip scattering occurs.

According to one embodiment of the present disclosure, the first adhesive layer may further include a tackifier such as a rosin resin, a terpene resin, a phenolic resin, a styrene resin, an aliphatic petroleum resin, an aromatic petroleum resin, or an aliphatic/aromatic copolymer petroleum resin.

According to one embodiment of the present disclosure, a method of forming the first adhesive layer including the above-described components on the substrate film is not particularly limited. For example, the method of forming the first adhesive layer may be a method of forming the first adhesive layer by applying the adhesive composition of the present disclosure directly onto the substrate film, or a method of applying the adhesive composition onto a peelable substrate to form a first adhesive layer, and then transferring the first adhesive layer from the peelable substrate onto the substrate film.

According to one embodiment of the present disclosure, the method of applying and drying the adhesive composition is not particularly limited, and for example, the method may be a method of directly applying the composition containing the above-described components, or a method of diluting the composition in a suitable organic solvent, applying the dilution by a known means such as a comma coater, a gravure coater, a die coater, or a reverse coater, and then removing the solvent by drying at a temperature of 60° C. to 200° C. for 10 seconds to 30 minutes. In addition, in the above process, an aging process may be additionally performed for a sufficient crosslinking reaction of the adhesive.

According to one embodiment of the present disclosure, the thickness of the first adhesive layer is not particularly limited, but may be, for example, in the range of 10 μm to 500 μm.

According to one embodiment of the present disclosure, the second adhesive layer may be formed on the first adhesive layer and may include the adhesive film for a semiconductor according to the above-described embodiment. Details regarding the adhesive film for a semiconductor include all of the details described above.

According to one embodiment of the present disclosure, the thickness of the second adhesive layer is not particularly limited, but may be, for example, in the range of 1 μm to 100 μm, or 3 μm to 50 μm.

According to one embodiment of the present disclosure, the dicing die-bonding film may further include a release film formed on the second adhesive layer. Examples of the release film that may be used include one or more plastic films selected from among a polyethylene terephthalate film, a polytetrafluoroethylene film, a polyethylene film, a polypropylene film, a polybutene film, a polybutadiene film, a vinyl chloride copolymer film, and a polyimide film.

According to one embodiment of the present disclosure, the surface of the release film may be release-treated with one or more of alkyd-based, silicone-based, fluorine-based, unsaturated ester-based, polyolefin-based, and wax-based release agents. Among these release agents, the heat-resistant alkyd-based, silicone-based or fluorine-based release agent is particularly preferable.

According to one embodiment of the present disclosure, the release film may be formed to have a thickness of, generally about 10 μm to 500 μm, preferably about 20 μm to 200 μm, but the thickness thereof is not limited thereto.

According to one embodiment of the present disclosure, a method for producing the above-described dicing die-bonding film is not particularly limited, and may be, for example, a method of sequentially forming the first adhesive layer, the second adhesive layer and the release film on the substrate film, or a method of separately preparing a dicing film (substrate film+first adhesive layer) and a release film having a die-bonding film or the second adhesive layer formed thereon, and then laminating these films to each other.

According to one embodiment of the present disclosure, the lamination method is not particularly limited, and may be a hot roll lamination method or a lamination press method. Among these methods, the hot roll lamination method is preferable in terms of continuous processability and efficiency. The hot roll lamination method may be performed at a temperature of 10° C. to 100° C. and a pressure of 0.1 Kgf/cm$^2$ to 10 Kgf/cm$^2$, but the conditions thereof are not limited thereto.

Hereinafter, the present disclosure will be described in detail with reference to examples. However, the examples according to the present disclosure may be modified into various different forms, and the scope of the present disclosure is not interpreted as being limited to the examples described below. The examples of the present specification are provided to more completely explain the present disclosure to those skilled in the art.

Example 1

70 g of butyl acrylate, 15 g of acrylonitrile, 5 g of glycidyl methacrylate and 10 g of benzyl methacrylate were mixed together in 100 g of toluene and allowed to react at 80° C. for about 12 hours, thereby synthesizing an acrylate resin (weight-average molecular weight: about 400,000 g/mol, and glass transition temperature: 10° C.) to which a glycidyl group has been introduced as a branched chain.

A magnetic filler (HF-03C, Nopion Co., Ltd.) including iron (III) oxide as a core and a coating layer formed by coating the core with a composition containing the following components to have a thickness of 50 nm was prepared: 4 g of phenolic resin KA-1160 (manufactured by DIC Corp., cresol novolac resin, hydroxyl equivalent weight: 190 g/eq, softening point: 65° C.) as an epoxy resin curing agent; 2 g of epoxy resin EOCN-103S (manufactured by Nippon Kayaku Co., Ltd., cresol novolac-type epoxy resin, epoxy equivalent weight: 214 g/eq, softening point: 80° C.); 5 g of liquid epoxy resin RE-310S (manufactured by Nippon Kayaku Co., Ltd., bisphenol A epoxy resin, epoxy equivalent weight: 180 g/eq), and 5 wt % of yttrium oxide. 85 g of the magnetic filler was milled in methyl ethyl ketone as a solvent by a milling machine.

Then, 4 g of an acrylate resin (Mw: 400,000, glass transition temperature: 10° C.), 0.1 g of silane coupling agent A-187 (GE Toshiba Silicone, gamma-glycidoxypropyltrimethoxysilane), 0.1 g of dicyandiamide (DICY) as a curing accelerator, and 0.1 g of 2MA-OK were added to the milled magnetic filler and milled for additional 2 hours to obtain an adhesive resin composition solution for a semiconductor (solid content: 50 wt %). This adhesive resin composition solution was applied using an automatic coating machine to obtain an adhesive film for a semiconductor having a film thickness of 20 μm.

Example 2

An adhesive film for a semiconductor was obtained in the same manner as in Example 1, except that a magnetic filler including a coating layer formed by coating the core iron oxide (III) with a composition containing 10 wt % of yttrium oxide to a thickness of 50 nm was used.

Example 3

An adhesive film for a semiconductor was obtained in the same manner as in Example 1, except that 68 g of the magnetic filler was used so that the solid content of the adhesive resin composition solution for a semiconductor was controlled to 40 wt %.

Example 4

An adhesive film for a semiconductor was obtained in the same manner as in Example 1, except that 102 g of the magnetic filler was used so that the solid content of the adhesive resin composition solution for a semiconductor was controlled to 60 wt %.

Example 5

An adhesive film for a semiconductor was obtained in the same manner as in Example 1, except that a magnetic filler including a coating layer formed by coating the core iron oxide (III) with a composition containing 15 wt % of yttrium oxide to have a thickness of 100 nm was used.

Comparative Example 1

An adhesive film for a semiconductor was obtained in the same manner as in Example 1, except that a magnetic filler (HF-03, Nopion Co., Ltd.) not coated with yttrium oxide was used.

Comparative Example 2

An adhesive film for a semiconductor was obtained in the same manner as in Example 1, except that the magnetic filler was not used.

Comparative Example 3

An adhesive film for a semiconductor was obtained in the same manner as in Example 1, except that a magnetic filler including a coating layer formed by coating the core iron oxide (III) with a composition containing less than 5 wt % of yttrium oxide to have a thickness of 50 nm was used.

Comparative Example 4

An adhesive film for a semiconductor was obtained in the same manner as in Example 1, except that a magnetic filler including a coating layer formed by coating the core iron oxide (III) with a composition containing 20 wt % of yttrium oxide was used.

Experimental Example 1

Measurement of Volume Resistivity

Using a volume resistivity meter (Hioki Korea Co., Ltd.), voltage V was applied to the adhesive film for a semiconductor, obtained in each of Examples 1 and 2 and Comparative Example 1, and current Iv flowing through the adhesive film for a semiconductor was measured. Using the measured value, volume resistivity Rv was calculated by Equation 1 below, and the calculation results are shown in Table 1 below.

$$Rv = V/Iv \qquad \text{[Equation 1]}$$

Experimental Example 2

Method for Power Loss Measurement

The power loss of the adhesive film for a semiconductor, obtained in each of Examples 1 and 2 and Comparative Examples 1 and 3, was measured by a network analyzer (E5071C, Agilent) using a method (microstrip line) of evaluating the power absorption in the near field.

TABLE 1

| | 1 V | 2.5 V | 5 V | 10 V | 25 V | 50 V |
|---|---|---|---|---|---|---|
| Example 1 (unit: ×10$^{10}$ Ω-cm) | 41 | 27 | 25 | 22 | 17 | 13 |
| Example 2 (unit: ×10$^{10}$ Ω-cm) | 44 | 54 | 48 | 42 | 37 | 35 |
| Comparative Example 1 (unit: ×10$^{10}$ Ω-cm) | 3 | 1.7 | 0.9 | 0.36 | 0.1 | — |
| Comparative Example 3 (unit: ×10$^{10}$ Ω-cm) | 5 | 2.2 | 1.5 | 0.4 | 0.2 | — |

FIG. 3 is a graph showing the results of measuring the volume resistivity of the adhesive film obtained in each of Examples 1 and 2 and Comparative Example 1. Referring to Table 1 above and FIG. 3, it was confirmed that Comparative Example 1, which included the magnetic filler not coated with yttrium oxide, had a low volume resistivity value and did not have a dielectric property.

In addition, it was confirmed that the result of measuring the volume resistivity of the adhesive film of Comparative Example 3, which included the magnetic filler including the coating layer containing yttrium oxide in an amount of 5 wt % based on the coating layer, was similar to the measurement result for Comparative Example 1, suggesting that the magnetic filler used in Comparative Example 3 exhibits an effect similar to that of the magnetic filler having no coating layer.

In contrast, it was confirmed that the adhesive film for a semiconductor obtained in each of Examples 1 and 2, which included the magnetic filler coated with yttrium oxide, had a rapidly increased volume resistivity compared to that of Comparative Example 1, and thus had dielectric properties, suggesting that it reduces noise between chips by effectively shielding electromagnetic waves.

FIG. 4 is a graph showing the power loss of the adhesive film obtained in each of Example 1 and Comparative Examples 1 and 2. It was confirmed that the adhesive film of Example 1, which included the magnetic filler coated with yttrium oxide, showed an increased power loss by absorbing electromagnetic waves. In contrast, the adhesive film of Comparative Example 1, which included the magnetic filler not coated with yttrium oxide, showed a power loss rate similar to that of Example 1, but did not have a dielectric property due to the low volume resistivity value thereof. Furthermore, it was confirmed that the adhesive film of Comparative Example 2, which did not include the magnetic filler, showed a low power loss rate.

FIG. 5 is a graph showing the power loss of the adhesive film obtained in each of Examples 1 to 3. Referring to FIG. 5, it was confirmed that the power loss rate of the adhesive film increased as the content of the magnetic filler increased.

Experimental Example 3

Analysis of Powder Particle Shape and Average Particle Size of Magnetic Filler FIG. 6 shows photographs taken with a scanning electron microscope (SEM) in order to analyze the particle shapes of the magnetic fillers used in Comparative Example 1 and Examples 2 and 5. Referring to FIG. 6, it can be confirmed that, as the content of yttrium oxide included in the coating layer of the magnetic filler increased, the degree of aggregation of the magnetic filler particles increased.

FIG. 7 is a graph showing the average particle size of the magnetic filler used in each of Comparative Example 1 and Examples 1, 2 and 5 depending on the content of yttrium oxide in the magnetic filler. Furthermore, Table 2 below shows wafer wettability depending on the content (wt %) of yttrium oxide in the coating layer. Specifically, each of the adhesive films having different yttrium oxide contents was cut in a circular shape having a diameter of 22 cm. Each of the circular films thus prepared was laminated onto a PO film coated with an adhesive layer, thus preparing dicing die-bonding films. Separately, an 80-μm wafer was laminated on a dicing film and cut to a size of 8 mm*8 mm. Then, the divided wafer and each adhesive film were thermally laminated to each other using a mounting device at 70° C., and whether the adhesive film would not adhere to the wafer was checked. The adhesive film that adhered to the wafer was evaluated as good, and the adhesive film that did not adhere to the wafer was evaluated as having a poor surface. The results of the evaluation are summarized in Table 2 below.

TABLE 2

| | Content (wt %) of $Y_2O_3$ in coating layer | | | | |
|---|---|---|---|---|---|
| | 0 wt % | 5 wt % | 10 wt % | 15 wt % | 20 wt % |
| Wafer wettability (70° C.) | Good | Good | Good | Good | Poor surface |

Referring to FIG. 7 and Table 2, it can be confirmed that, as the content of yttrium oxide in the coating layer of the magnetic filler increased, the cohesiveness of the magnetic filler increased, and thus the average particle size thereof increased. Specifically, it was confirmed that the average particle size of the magnetic filler in Comparative Example 1 was 2.9 μm, but the average particle size of the magnetic filler in Example 2, in which the content of yttrium oxide in the coating layer of the magnetic filler was 10 wt %, was 14.8 μm, which increased by five times compared to that in Comparative Example 1. In addition, it was confirmed that the average particle size of the magnetic filler in Example 5, in which the content of yttrium oxide in the coating layer of the magnetic filler was 15 wt %, was 29 μm, and when the content of yttrium oxide in the coating layer of the magnetic filler further increased, a large number of the magnetic filler particles were found on the B-stage surface of a 60-μm film over wire (FOW) containing the magnetic filler, suggesting that a wafer lamination process using the film is not easy.

Therefore, it was confirmed that electromagnetic interference could be effectively prevented by controlling the content of yttrium oxide in the coating layer and controlling the content of the magnetic filler in the adhesive resin composition.

As described above, the adhesive resin composition for a semiconductor according to one embodiment of the present disclosure and the adhesive film for a semiconductor including the same may effectively reduce electromagnetic interference by having an increased volume resistivity as a result of containing, in the polymer matrix, the magnetic filler including the core and the coating layer formed on the surface of the core.

The dicing die-bonding film according to one embodiment of the present disclosure may minimize noise caused by electromagnetic interference occurring between semiconductor packages, and solve the problem associated with noise caused by electromagnetic interference between chips.

Effects of the present disclosure are not limited to the above-described effects, and effects not mentioned herein will be clearly understood by those skilled in the art from the present specification and the accompanying drawings.

Although the present disclosure has been described above by way of limited embodiments, the present disclosure is not limited thereto. It should be understood that the present disclosure can be variously changed and modified by those skilled in the art without departing from the technical spirit of the present disclosure and within the range of equivalents to the appended claims.

What is claimed is:

1. An adhesive resin composition for a semiconductor containing:
    a polymer matrix comprising a (meth)acrylate-based resin comprising a (meth)acrylate-based repeating unit containing an epoxy-based functional group and a (meth)acrylate-based repeating unit containing an aromatic functional group, a curing agent comprising a phenolic resin, and an epoxy resin; and
    a magnetic filler dispersed in the polymer matrix and comprising a core and a coating layer formed on a surface of the core,
    wherein the coating layer comprises at least one material selected from the group consisting of yttrium oxide, magnesium oxide, and aluminum oxide in an amount of 5 parts by weight to 15 parts by weight based on 100 parts by weight of the coating layer.

2. The adhesive resin composition of claim 1, wherein the magnetic filler is contained in an amount of 30 parts by weight to 70 parts by weight based on 100 parts by weight of the polymer matrix.

3. The adhesive resin composition of claim 1, wherein the core is made of at least one material selected from the group consisting of iron carbide, ferrite, tin-manganese, iron (III) oxide, sendust, iron nitride, manganese-based ferrite (Mn-ferrite), manganese-magnesium-strontium-based ferrite (Mn—Mg—Sr-ferrite), and graphen.

4. The adhesive resin composition of claim 1, wherein the coating layer has a thickness of 10 nm to 500 nm.

5. The adhesive resin composition of claim 1, wherein the content of the coating layer comprised in the magnetic filler is 50 parts by weight to 150 parts by weight based on 100 parts by weight of the core.

6. The adhesive resin composition of claim 1, wherein the (meth)acrylate-based resin has a glass transition temperature of 0° C. to 20° C. and a weight-average molecular weight of 50,000 to 1,000,000.

7. The adhesive resin composition of claim 1, wherein the (meth)acrylate-based resin comprises 3 wt % to 30 wt % of the (meth)acrylate-based repeating unit containing the epoxy-based functional group.

8. An adhesive film for a semiconductor including the adhesive resin composition for a semiconductor according to claim 1.

9. A dicing die-bonding film comprising:
    a substrate film;
    a first adhesive layer formed on the substrate film; and
    a second adhesive layer formed on the first adhesive layer and comprising the adhesive film for a semiconductor according to claim 8.

* * * * *